(12) United States Patent
Sakamoto et al.

(10) Patent No.: US 8,723,505 B2
(45) Date of Patent: May 13, 2014

(54) CURRENT SENSOR STRUCTURE

(75) Inventors: Akinori Sakamoto, Shimada (JP); Yasunori Kawaguchi, Shimada (JP)

(73) Assignee: Yazaki Corporation, Tokyo (JP)

( * ) Notice: Subject to any disclaimer, the term of this patent is extended or adjusted under 35 U.S.C. 154(b) by 456 days.

(21) Appl. No.: 13/198,207

(22) Filed: Aug. 4, 2011

(65) Prior Publication Data
US 2012/0032667 A1  Feb. 9, 2012

(30) Foreign Application Priority Data

Aug. 5, 2010  (JP) .................................. 2010-175897

(51) Int. Cl.
*G01R 1/20* (2006.01)
*G01R 15/20* (2006.01)

(52) U.S. Cl.
CPC .................................... *G01R 15/202* (2013.01)
USPC ........................................ 324/126; 324/117 H

(58) Field of Classification Search
None
See application file for complete search history.

(56) References Cited

U.S. PATENT DOCUMENTS 7,659,709 B2 *  2/2010  Lepine et al. ............. 324/117 H
8,279,035 B2 *  10/2012  Yoshikawa et al. ............. 336/96

FOREIGN PATENT DOCUMENTS

JP  2006-078316 A  3/2006
JP  2009-222729 A  10/2009

* cited by examiner

*Primary Examiner* — Paresh Patel
(74) *Attorney, Agent, or Firm* — Edwards Wildman Palmer LLP

(57) ABSTRACT

A current sensor structure includes a substantially ring-shaped magnetic core comprising layers of magnetic plates to be accommodated in an insulating case and secured to the case via a molding compound. Projections protruding in the magnetic plate's thickness direction are provided either on a front-side wall portion of the case in the thickness direction or on a surface of the magnetic core in the thickness direction. By virtue of, the surface of the magnetic core is supported by the front-side wall portion via the projections, leaving a gap between this surface and the wall portion to the same height as that of the projections. The gap is filled with the molding compound. Dilative and contractive deformation of the case in the direction orthogonal to the thickness direction is absorbed by the molding compound in the gap to prevent the stress from acting upon the magnetic core.

4 Claims, 3 Drawing Sheets

CURRENT SENSOR STRUCTURE

CROSS-REFERENCE TO RELATED APPLICATION

The Japan Patent Application No. 2010-175897 upon which this patent application is based is incorporated by reference herein.

BACKGROUND OF THE INVENTION

1. Field of the Invention

The present invention relates to a current sensor structure that employs a molding compound for prevention of deformation of a core secured in a case, the core deformation being caused by dilation and contraction of the case.

2. Description of the Related Art

A number of state of the art current sensor configurations are advocated that are incorporated in an electrical junction box provided in automobiles and hybrid automobiles. For example, Japanese Patent Application Laid-Open Publication No. 2009-222729 discloses a current sensor in which a rectangular and ring-shaped metal magnetic core, which has a notch portion and takes a non-continuous appearance, is accommodated in a case made of insulating synthetic resin. A hall element is arranged in the notch portion of the core. A busbar made of conductive metal is passed through the core.

A space defined by an outer circumferential surface of the core and an inner circumferential surface of the case is filled with an insulating molding compound so that the core is secured to the case. A magnetic field caused by a current flowing through the busbar is amplified by the presence of the core and is detected by the hall element.

A positioning projection is provided on the inner circumferential surface of the case in the radial direction. The positioning projection is adapted to be brought into abutment on an outer circumferential surface of the core in the radial direction for prevention of position gap of the core while filling of the molding compound (see FIGS. 1 to 3).

Japanese Patent No. 4,418,332 discloses another known current sensor that employs a hall element. A wiring harness is passed through a core and secured to a case using a band. Power is supplied via a connector portion of the case, and the detected voltage is output on the same connector portion (see FIGS. 1 and 2).

In such current sensors of state of the art configurations as disclosed in the No. 2009-222729 document, the projection formed on the inner surface of the case is brought into abutment on the outer circumferential surface of the core in the radial direction, and this abutment structure facilitates prevention of the core getting out of position due to pressure in the course of filling of the molding compound. Since the surface of the core in its thickness direction is adhered and secured to the inner surface of the wall portion of the front side of the case via the thick-walled molding compound, the core stress in the direction of the case's dilation and contraction acts upon the core via the thick-walled molding compound as the case experiences dilation and contraction due to rapid change in temperature and humidity (i.e., the case's dilation and contraction causes the stress to act upon the core). As a result, the shape of the core changes, which in turn causes decrease in output and accuracy in current sensing.

SUMMARY OF THE INVENTION

In view of the above-identified problem, an object of the present invention is to provide a current sensor structure that allows mitigation in the stress acting upon the core due to the case's dilation and contraction and readily prevents the core deformation in a reliable manner.

In order to attain the above objective, a first aspect of the present invention provides a current sensor structure adapted to accommodate a substantially ring-shaped magnetic core comprising layers of magnetic plates in an insulating case, the magnetic core being secured to the case using a molding compound.

The current sensor structure comprises (a) a plurality of projections provided either on a wall portion of the case in a magnetic plate's thickness direction or on a surface of the magnetic core in the magnetic plate's thickness direction, the projections protruding in the magnetic plate's thickness direction such that the surface of the magnetic core is supported by the wall portion via the projections; and (b) a gap provided between the surface of the magnetic core and the wall portion of the case, the gap having a same height as that of the projections, and being adapted to be filled with the molding compound such that dilative and contractive deformations of the case in a direction orthogonal to the magnetic plate's thickness direction is absorbed by the molding compound within the gap and thereby a stress is prevented from acting upon the magnetic core.

The construction and arrangement described above features the presence of the molding compound with a thickness corresponding to the height of the projections, the molding compound residing between the wall portion of the case in the magnetic plate's thickness direction and the surface of the magnetic core in the magnetic plate's thickness direction.

Accordingly, when the wall portion of the case made of insulating synthetic resin experiences dilative and contractive deformation in a direction orthogonal to the thickness direction of the magnetic plates (i.e., a magnetic plate length direction) and a width direction, the molding compound is deformed in the orientation of the dilation and contraction of the case to absorb the dilative and contractive deformation of the case and prevent or mitigate transfer of the dilative and contractive deformation of the case to the magnetic core. In this manner, the stress acting upon the magnetic core is mitigated and deformation of the magnetic core is avoided. Also, the projections are used to ensure the presence of the gap between the magnetic core and the wall portion of the case, and ensure the thickness of the molding compound within the gap.

Preferably, the projections are three in number each provided at corresponding each of apexes of a virtual triangle.

With the construction and arrangement described above, the magnetic core is supported on the wall portion of the case via the three projection in a three-point-support manner and stably without oscillation, the gap between the magnetic core and the wall portion of the case, and the thickness of the molding compound filling the gap are kept uniform, and position gap of the magnetic core with respect to the wall portion of the case in the magnetic plate thickness direction is prevented.

Preferably, the projections of the case are resin-molded on the case in one piece therewith so that they can be resin-molded on the wall portion of the case in one piece therewith and simultaneously with resin-molding of the case as such.

Preferably, the magnetic plates each have a projection on a front surface thereof and a recess on a reverse side thereof, the projection being configured to be brought into fitting engagement with the recess of adjacent one of the magnetic plates, and the projection of the magnetic plate constituting the surface of the magnetic core is brought into abutment on the wall portion of the case.

With the construction and arrangement described above, the magnetic plates are positioned and secured to each other by the engagement of the projection with the recess to increase stiffness, deformation of the molding compound in absorbing the dilation and contraction of the case is simultaneously received by the magnetic plates constituting the magnetic core to prevent deformation of the magnetic core. The projection is processed simultaneously with the press molding of the magnetic plate.

Some objects, features and advantages of the present invention include, but not limited to the following aspects.

The projections ensure the gap between the wall portion of the case in the magnetic plate thickness direction and the surface of the core in the magnetic plate thickness direction and also ensure the thickness of the molding compound filling the gap, so that the dilative and contractive deformation of the case in the direction orthogonal to the thickness direction of the magnetic plates is effectively absorbed by the molding compound. The stress acting upon the core as a result of the case's dilation and contraction is decreased, and the core deformation can be effectively prevented, thereby improving the accuracy in current sensing.

Further, the projection can be readily formed by resin-molding on the case made of insulating synthetic resin in one piece therewith, or can be readily formed by press working on the magnetic plate, so that no additional component needs to be provided to maintain the gap between the case and the core, which leads to simplified structure and reduced manufacturing costs.

The magnetic core is supported by the wall portion of the case in a three-point-support manner, and thus the position gap of the magnetic core in the magnetic plate thickness direction is prevented. Also, the thickness of the molding compound within the gap is made uniform, so that the absorption of the dilative and contractive deformation of the case by the molding compound is reliably obtained.

Also, since the projection is resin-molded on the case made of insulating synthetic resin in one piece therewith, no additional component needs to be provided to maintain the gap between the case and the core, and the structure can be simplified with reduced manufacturing costs.

In addition, by virtue of engagement of the projection with the recess, the magnetic plates are secured to each other, increasing stiffness of the magnetic core to be resistive to deformation. Also, since the projection is formed by press working simultaneously with pressing molding of the magnetic plate, no additional component needs to be provided to maintain the gap between the case and the core, and the structure can be simplified with reduced manufacturing costs.

Other objects, features, and advantages of the present invention will be apparent in view of this disclosure to those skilled in the art.

BRIEF DESCRIPTION OF THE DRAWINGS

The present invention is described in exemplary embodiments in the following description with reference to the drawings, in which like numbers represent the same or similar elements, as follows.

DETAILED DESCRIPTION OF THE EXEMPLARY EMBODIMENTS

A current sensor structure according to exemplary embodiments of the present invention are described with reference to FIGS. 1 to 5

First Embodiment

Figure 1A:
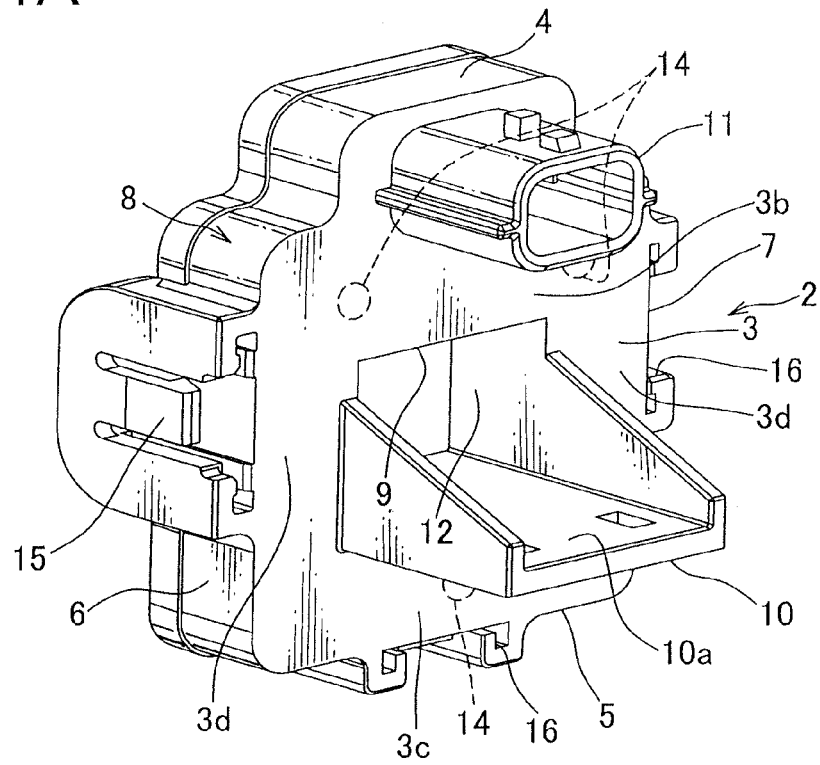
FIG. 1A is a front perspective view of a case of a current sensor structure according to a first embodiment of the present invention.
Figure 1B:
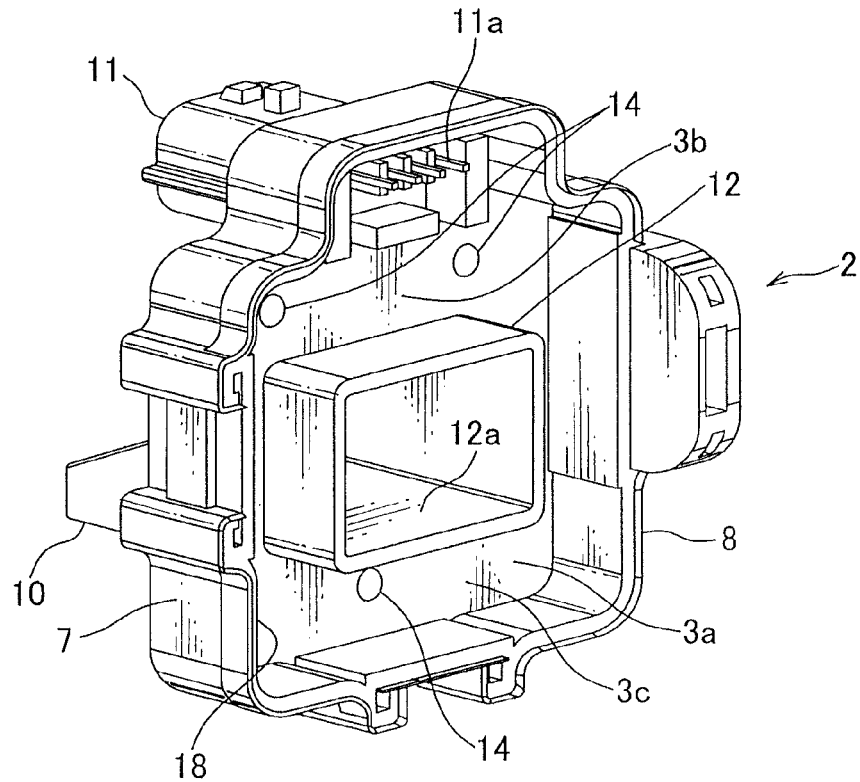
FIG. 1B is a rear perspective view of the case of the current sensor structure according to the first embodiment of the present invention.
Figure 2:
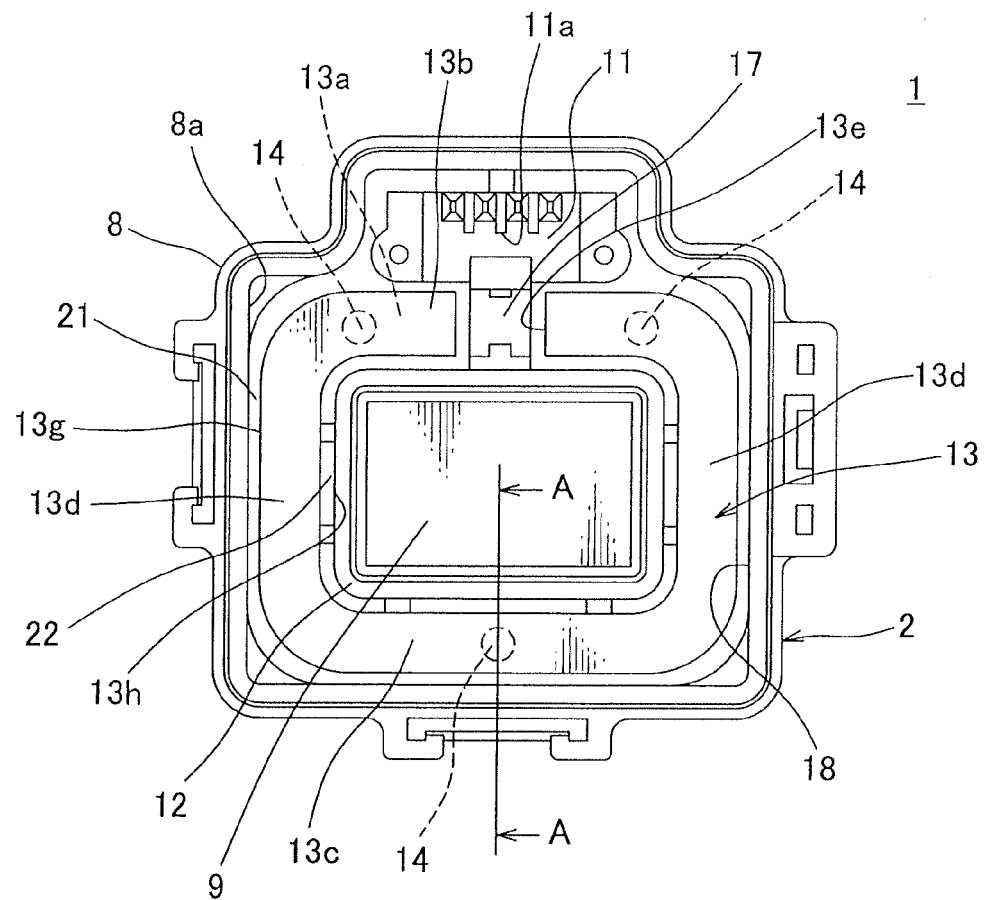
FIG. 2 is a plan view of an inner structure of the same case.
Figure 3:
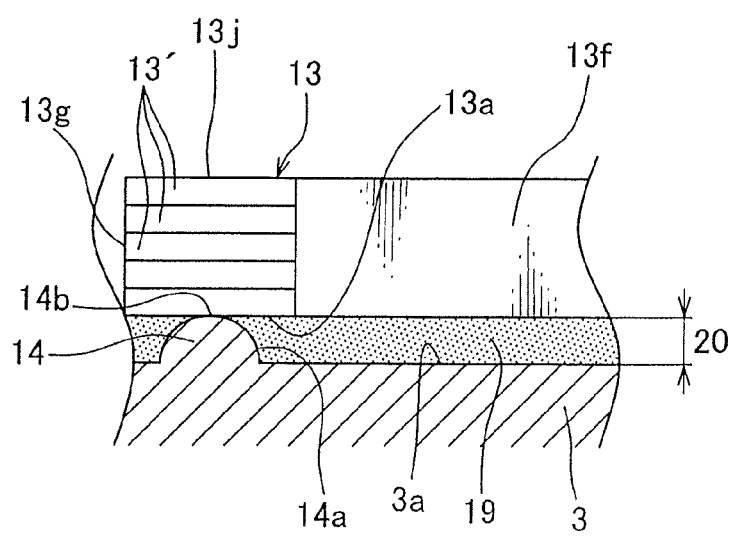
FIG. 3 is a cross-sectional view taken along the line A-A of FIG. 2 illustrating a state in which the case and a magnetic core are in contact with to each other.

FIG. 1 to FIG. 3 illustrate a first embodiment of the current sensor structure of the present invention.

Referring to FIGS. 1A and 1B, there is shown a current sensor structure 1 that comprises a case 2 made of insulating synthetic resin. The case 2 comprises (a) a vertically extending front-side wall portion 3; (2) a circumferential wall 8, which comprises (i) an upper wall 4, (ii) a lower wall 5, (iii) a left wall 6, and (iv) a right wall 7; (c) a rectangular opening 9 extending through the front-side wall portion 3 and at the substantially central portion thereof; (d) a substantially U-shaped electrical wire guiding wall 10 protruding frontward from the opening 9; (e) a connector 11 at the upper portion of the front-side wall portion 3 in a horizontal manner; and (f) a frame wall 12 through which a circuit is allowed to extend, the frame wall 12 extending in communication with the opening 9 and protruding on a back surface (inner surface) 3a of the front-side wall portion 3 (as shown in FIG. 1B).

The current sensor structure 1 features a plurality of projections 14 provided on the back surface 3a of the front-side wall portion 3 such that they surround the frame wall 12. The projections 14 are configured to be brought into abutment on a front-side surface 13a (see FIG. 3) of a magnetic core 13 (FIG. 2) in its thickness direction, the magnetic core 13 being made of magnetic metal material.

In the first embodiment, there is provided three projections 14, two projections 14 on the upper right side and the upper left side with respect to the front-side wall portion 3, and the other one at a lower central portion.

As shown in FIG. 3, the projections 14 of this embodiment have a semi-circular or substantially hemispherical cross-sectional shape, and include a curved surface 14a and a top portion (apex) 14b constituting to the curved surface 14a. The projections 14 have the same size and shape. Also, the projections 14 are each provided on the front-side wall portion 3 of the case 2 in one piece therewith.

The front-side wall portion 3 around the frame wall 12 continues in a rectangular manner to upper and lower wall portions 3b, 3c having the upper and lower projections 14, respectively, and left and right wall portions 3d having no projection 14. The back surfaces (inner surfaces) 3a of the wall portions 3b to 3d defines the same vertical plane. A not-shown circuit component such as an electrical wire and a busbar is allowed to be passed through the opening 9 into the frame wall 12.

A horizontal lower wall portion 12a of the frame wall 12 continues to a lower wall portion 10a of the electrical wire guiding wall 10 on the front-side to be on the same plane.

There is provided the circumferential wall 8 of the case 2 around the outer surface of the frame wall 12 to substantially the same degree of protrusion as the frame wall 12.

As shown in FIG. 1A, a lock-arm 15 is provided on the outer surface of the left wall 6 (vertically-extending left-side wall).

There is provided guiding rails 16 on the outer surfaces of the left wall 6 and the right wall 7. As an example, a through-bracket (not shown) of a component such as an electrical junction box to be attached and secured to the structure 1 is inserted into and brought into engagement with the lock-arm 15 and the guide rails 16.

The upper connector 11 for input and output includes a housing in one piece with the case 2 (for simplicity indicated by the same reference sign 11), and terminals 11a inside of the housing. The terminals 11a are each connected to corresponding each of lead wires (not-shown) of the hall element (sensor main body) 17 (see FIG. 2).

The circumferential wall 8 of the case 2 includes a rear opening 18 (see FIG. 1B).

As shown in FIG. 2, the rectangular and non-continuous ring-shaped magnetic core 13 is introduced into the case 2 via the rear opening 18 of the case 2. The "non-continuous ring shape" indicates that the circumference of the magnetic core 13 at its upper portion includes a slit-like notch portion 13e. The hall element 17 is placed in the notch portion 13e.

The vertical front surface 13a (see FIG. 3) of the upper side 13b of the magnetic core 13 is brought into abutment on the upper two projections 14 of the front wall 3 of the case 2, and the vertical front surface 13a (see FIG. 3) of the lower-side portion 13c of the magnetic core 13 is brought into abutment on the lower one projection 14 of the front wall 3 of the case 2. In this state, the case 2 is made horizontal, and the gap 20 between the magnetic core 13 and the front wall 3 of the case 2 is filled with the molding compound 19 (see FIG. 3) via the rear (upper) opening 18.

The molding compound 19 may comprise epoxy resin, PBT (polybutylene terephthalate) resin, or urethane resin.

Referring to FIG. 3 (a cross-sectional view taken along the line A-A of FIG. 2), there is provided the gap 20 between the back surface (rear surface) 3a of the front-side wall portion 3 of the case 2 and the front surface 13a of the magnetic core 13, the gap 20 being larger than a conventional one and having the same height as the degree of protrusion of the projections 14 (a conventional gap is substantially zero). The gap 20 is filled with the molding compound 19. By virtue of the molding compound 19, the back surface 3a of the front-side wall portion 3 of the case 2 is adhered and secured to the front surface 13a of the magnetic core 13.

The size and dimension of the gap 20 should preferably defined such that the molding compound 19 is allowed to absorb to a sufficient degree the dilation and contraction of the case 2 in the horizontal and vertical directions of the front-side wall portion 3.

In a state where the molding compound 19 is hardened (or solidified), even when the dilative and contractive deformation of the front-side wall portion 3 of the case 2 is transferred to the molding compound 19 within the gap 20, the dilation and contraction is absorbed by virtue of thickness of the molding compound 19, which decreases (mitigates) the stress acting upon the magnetic core 13, and thereby prevents deformation of the magnetic core 13. Amplifying effect of the magnetic field by the magnetic core 13 can be made with accuracy, and the distance between the hall element 17 in the notch portion 13e of the magnetic core 13 and the magnetic core 13 are accurately defined, and difference in the characteristics of the hall element 17 is prevented, which achieves accurate current sensing.

Also, it suffices that the projections 14 are molded on the case 2 in one piece therewith to maintain the gap 20 between the case 2 and the magnetic core 13, eliminating the need of providing additional component, so that increase in the manufacturing costs can be avoided.

Further, since three projections 14 are arranged at the apexes of a virtual triangle, the surface 13a of the magnetic core 13 and the projections 14 are in contact with each other via three points without leaving a gap therebetween. In this manner, oscillation of the magnetic core 13 is prevented, and thus the positioning of the magnetic core 13 with respect to the front-side wall portion 3 of the case 2 can be made with stability and accuracy.

Referring to FIG. 3, the magnetic core 13 is a multilayered core comprising a plurality of magnetic metal plates 13' disposed in an overlapping manner on each other in the thickness direction of the magnetic core 13, so that the tip 14b of the projection 14 is brought into abutment on the front surface 13a of the magnetic core 13 in its thickness direction (accordingly in the thickness direction of the magnetic metal plates 13'). Projections 14 are provided (in abutment) at a centre of the core in the width direction of a horizontal upper side 13b and a lower-side portion 13c (see FIG. 2). In FIG. 3, the reference sign 13f indicates a rectangular space inward of the magnetic core 13.

Referring again to FIG. 2, the upper two projections 14 may be brought into abutment on the upper portion of the vertical left and right sides 13d of the magnetic core 13. The cross section of the projection 14, in addition to the substantially semi-circular shape illustrated in FIG. 3, may be substantially rectangular or substantially trapezoidal. In view of stably supporting the magnetic core 13, the shape may preferably be substantially hemispherical in a point-contact manner.

As shown in FIG. 2, there are a gap 21 between the outer circumferential surface 13g of the magnetic core 13 in the radial direction and the inner surface 8a of the circumferential wall 8 of the case 2, and a gap 22 between the inner circumferential surface 13h of the magnetic core 13 and the frame wall 12 of the case 2. These gaps 21, 22 are also filled with the molding compound 19, so that the magnetic core 13 and the case 2 are adhered to and secured to each other in the radial direction.

The magnetic core 13 is more susceptible to the dilation and contraction of the case 2 in a length direction and a width direction of the magnetic metal plate 13' than in the thickness direction of the magnetic metal plate 13' (the surface area of the magnetic plate 13' closest to the front-side wall portion 3 of the case 2 is the larger in the length direction and the width direction than in the thickness direction). In order to prevent deformation of the magnetic core 13, the projection 14 needs to be provided not in the radial direction of the magnetic core 13 but in its thickness direction. This also applies to the second embodiment.

Referring to FIG. 2, the molding compound is filled into the space on the rear surface 13j (FIG. 3) of the magnetic core 13, so that the magnetic core 13 is completely sealed by the molding compound 19, and the molding compound 19 on the side of the rear surface 13j serves as a rear end of the case 2 (which as a matter of fact does not exist). The rear end of the terminals 11a of the connector 11 is solder-connected to the lead wire of the hall element 17, and from the front side, a mating connector (not shown) for input and output is connected to the connector 11.

Second Embodiment

The current sensor structure according to a second embodiment of the present invention is described with reference to FIGS. 4 and 5.

In contrast to the first embodiment where the projections 14 are provided on the case 2, the current sensor structure 31 of the second embodiment includes projections 34 that are provided on a magnetic core 33. It should be noted that the remaining aspects of the configuration are the same as in the first embodiment, and like elements have the like reference signs, detailed description of which is not repeated here.

Figure 4:
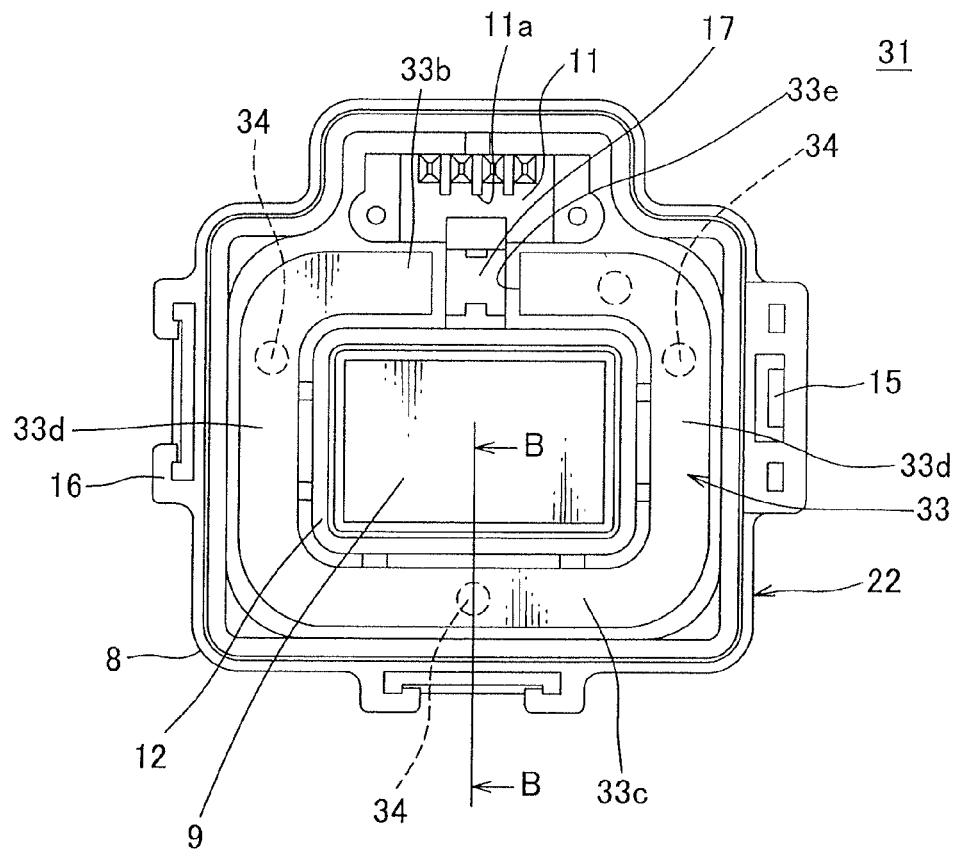
FIG. 4 is a plan view of an inner structure of a case of a current sensor structure according to a second embodiment of the present invention.

Referring to FIG. 4, the reference sign 32 indicates a case, the reference sign 12 indicates a frame wall of the case 32, the reference sign 17 indicates a hall element residing in a notch portion 33e of the magnetic core 33, the reference sign 11a indicates a terminal of a connector 11, the reference sign 15 indicates a lock portion for securing of the circumference of the case, and the reference sign 16 indicates a guide portion.

In the context of the example of FIG. 4, each of the projections 34 are arranged at a position slightly different from that of the example of FIG. 2. Specifically, upper two projections 34 are each arranged not on the upper side 33b of the magnetic core 33 but on corresponding each of upper portions of a left and right sides 33d of the magnetic core 33. The position of one lower projection 34 is the same as in the first embodiment, i.e., the lower projection 34 is provided at the centre of a lower side 33c of the magnetic core 33.

Figure 5:
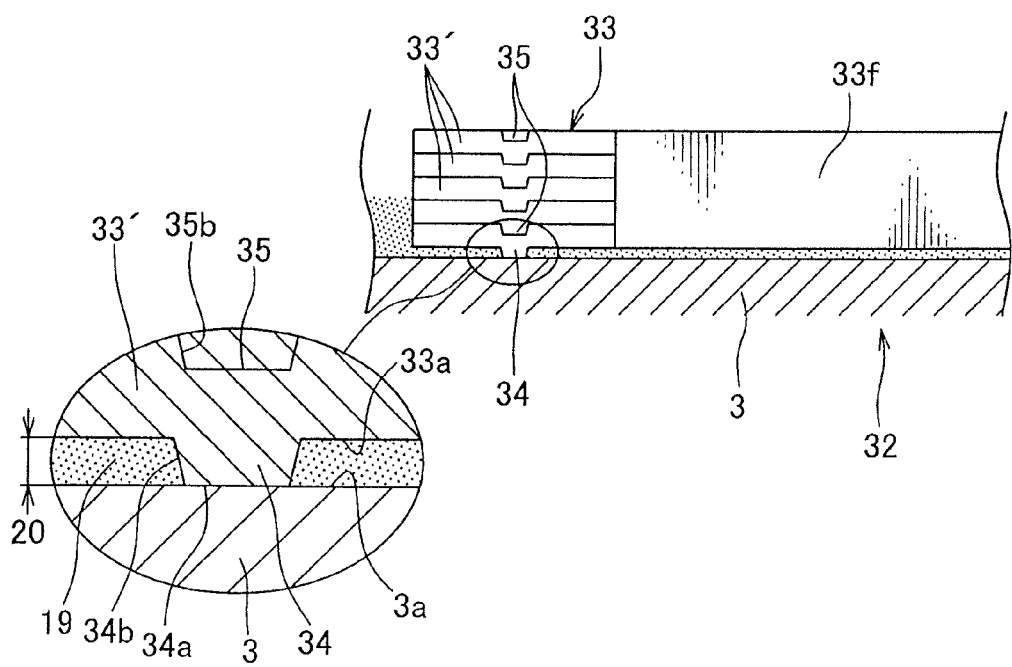
FIG. 5 is a cross-sectional view taken along the line B-B of FIG. 4 illustrating a state in which the case and a magnetic core are in contact with each other (with enlarged view of principal part indicated by an ellipse).

As shown in FIG. 5 (as is the case of the example of FIG. 3), the magnetic core 33 comprises layers of plate-shaped magnetic material (magnetic metal plates) 33' such as magnetic steel sheet or permalloy (an alloy of nickel and iron). A front surface 33a of each magnetic metal plate 33' includes a projection 34 at the same location and in the same orientation by press embossing, and an opposite side of this side where the projection 34 protrudes (i.e., back side) includes a recess 35 having the same size and shape, which means that, by means of drawing of the magnetic metal plate 33', the projections 34 of each of the magnetic metal plates 33' constituting the intermediate layer of the magnetic core 33 are brought into fitting engagement with the corresponding recesses 35 of the adjacent magnetic metal plates 33' without leaving a gap therebetween, so that the magnetic metal plates 33' are secured to each other.

The recess 35 of the magnetic metal plate 33' constituting the rear end of the magnetic core 33 is left unoccupied. Also, the projection 34 of the magnetic metal plate 33' constituting the front surface 33a of the magnetic core 33 is brought into abutment on the inner surface (back surface) 3a of the front wall 3 of the case 32, and thus the gap 20 larger than a conventional one (a conventional gap being substantially zero) is provided between the front wall 3 of the case 32 and the magnetic metal plate 33' of the front end, the molding compound 19 filling the gap 20 in a thick-walled manner absorbs the dilation and contraction of the case 32, and mitigates the dilative and contractive stress transferred to the magnetic core 33. These effects and advantages (explanation omitted) are the same as in the case of the first embodiment.

The magnetic core 33 comprises a plurality of magnetic metal plates 33'. The magnetic metal plates 33' are placed in engagement with and secured to each other via the projections 34 and the recesses 35 so that there is no position gap. If the molding compound 19 cannot completely absorb the dilation and contraction, only the front end magnetic metal plate 33' is not acted upon by the dilation and contraction force, but all of the magnetic metal plates 33' are simultaneously acted upon by the dilation and contraction force, so that the dilative and contractive stress acting upon the magnetic core 33 is kept extremely small.

The projection 32 of the second embodiment has a trapezoidal cross section and includes a flat tip (front end) surface 34a, and upper, lower, left, and right tapered sloping surfaces 34b. The recess 35 has, in a similar manner as in the case of the projection 34, a flat bottom surface (for simplicity indicated by the reference sign 35) and upper, lower, left, and right tapered sloping surfaces 35b. The upper, lower, left, and right sloping surfaces 34b of the projection 34 are brought into fitting engagement with the upper, lower, left, and right sloping surfaces 35b of the recess 35 in the direction in which the projections protrudes without leaving a gap therebetween, so that a securing force of the magnetic metal plates 33' is increased.

Referring to FIG. 5, the reference sign 33f indicates a rectangular space inside of the magnetic core 33. It is a known technique to provide a projection 34 and a recess 35 in an intermediate layer of the magnetic core 33 for fitting engagement (a projection 34 of the front end is not provided) as disclosed in the Japanese Patent Application Laid-Open Publication No. 2005-108976. Each projection 34 may be readily formed by pressing each of the magnetic metal plates 33', and a separate component does not need to be provided for maintaining the gap 20 between the case 32 and the magnetic core 33, which contributes to cost-effectiveness and inexpensive manufacturing process. The exemplary case 32 of FIG. 4 is a variant in which the projection 14 is eliminated from the case 2 of the case 32 in FIG. 1, and the remaining shape is the same.

It should be noted that the above embodiments involves the substantially rectangular core 13, 33, but it is also possible to provide the gap 20 between the magnetic core 13, 33 and the case 2, 32 by means of the projection 14, 34 even when circular and non-continuous ring-shaped core (not shown) and the case having the complementary shape (not shown) are used. Also, in the above embodiments, either the case 2 or the magnetic core 33 includes the projection 14, 34. However, both of the case 2 and the magnetic core 33 may include the projection 14, 34 (for example, two projections 14 on the upper side of the case 2 and one projection 34 on the lower side of the magnetic core 33) provided at different regions such that they do not overlap with each other.

Also, the present invention is suitable for, but not limited to the current sensor structure 1, 31, as the current sensor as such, or the core securing structure of the current sensor, a method for making a current sensor, a method for securing the core of the current sensor.

The current sensor structure of the present invention is suitable for application such as preventing core deformation due to dilation and contraction of a current sensor incorporated in an electrical junction box or a junction block in a hybrid automobile or other automotive power distribution, and improving accuracy in current sensing.

That which is claimed is:

1. A current sensor structure adapted to accommodate a substantially ring-shaped magnetic core comprising layers of magnetic plates in an insulating case, the magnetic core being secured to the case using a molding compound, the current sensor structure comprising:

(a) a plurality of projections provided either on a wall portion of the case in a magnetic plate's thickness direction or on a surface of the magnetic core in the magnetic plate's thickness direction, the projections protruding in the magnetic plate's thickness direction such that the surface of the magnetic core is supported by the wall portion via the projections; and (b) a gap provided between the surface of the magnetic core and the wall portion of the case, the gap having a same height as that of the projections, and being adapted to be filled with the molding compound such that dilative and contractive deformations of the case in a direction orthogonal to the magnetic plate's thickness direction is absorbed by the molding compound within the gap and thereby a stress is prevented from acting upon the magnetic core.

2. The current sensor structure as set forth in claim 1, wherein the projections are three in number each provided at corresponding each of apexes of a virtual triangle.

3. The current sensor structure as set forth in claim 1, wherein the projections of the case are resin-molded on the case in one piece therewith.

4. The current sensor structure as set forth in claim 1, wherein the magnetic plates each have a projection on a front surface thereof and a recess on a reverse side thereof, the projection being configured to be brought into fitting engagement with the recess of adjacent one of the magnetic plates, and the projection of the magnetic plate constituting the surface of the magnetic core is brought into abutment on the wall portion of the case.

* * * * *